(12) United States Patent
Bailey et al.

(10) Patent No.: US 11,039,551 B1
(45) Date of Patent: Jun. 15, 2021

(54) DATA CENTER THAT REGULATES SUPPLY AIR TO MULTIPLE COMPARTMENTS

(71) Applicant: DELL PRODUCTS, L.P., Round Rock, TX (US)

(72) Inventors: Mark M. Bailey, Round Rock, TX (US); Trey S. Wiederhold, Cedar Park, TX (US); Ty R. Schmitt, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/743,193

(22) Filed: Jan. 15, 2020

(51) Int. Cl.
*H05K 7/20* (2006.01)
*H05K 7/14* (2006.01)

(52) U.S. Cl.
CPC ....... *H05K 7/20736* (2013.01); *H05K 7/1497* (2013.01); *H05K 7/20181* (2013.01); *H05K 7/20836* (2013.01)

(58) Field of Classification Search
CPC .. H05K 7/2059; H05K 7/207; H05K 7/20745; H05K 7/20836
See application file for complete search history.

(56) References Cited

U.S. PATENT DOCUMENTS

| | | | |
|---|---|---|---|
| 7,724,513 B2 * | 5/2010 | Coglitore | H05K 7/1497 361/679.47 |
| 7,841,199 B2 * | 11/2010 | VanGilder | H05K 7/20745 62/259.2 |
| 7,992,402 B2 * | 8/2011 | VanGilder | G06F 1/20 62/259.2 |
| 8,156,753 B2 * | 4/2012 | VanGilder | H05K 7/20745 62/259.2 |
| 8,320,125 B1 | 11/2012 | Hamburgen et al. | |
| 8,833,001 B2 * | 9/2014 | Gardner | H05K 7/1497 52/64 |
| 9,410,339 B2 * | 8/2016 | Gardner | E04B 1/66 |
| 9,459,015 B2 | 10/2016 | Karamanos et al. | |
| 9,883,618 B2 | 1/2018 | Pitwon et al. | |
| 9,907,212 B2 * | 2/2018 | Parizeau | H05K 7/2079 |
| 10,030,383 B2 * | 7/2018 | Gardner | E04B 1/34384 |
| 10,356,933 B2 * | 7/2019 | Bailey | H05K 7/1485 |

(Continued)

FOREIGN PATENT DOCUMENTS

JP 2015194280 A * 11/2015
JP 2018048809 A * 3/2018

*Primary Examiner* — Robert J Hoffberg
(74) *Attorney, Agent, or Firm* — Isidore PLLC (57) ABSTRACT

A data center regulates supply air provided to multiple compartments including an information technology (IT) compartment having a cold aisle and a hot aisle and an operation technology (OT) compartment. An environmental subsystem of the data center includes an air handling system that provides supply air to the cold aisle and that draws return air from the hot aisle to moderate or cool a temperature of IT component(s) that may be installed within the IT compartment. Airflow regulation device(s) are positioned in at least one of (i) a supply air passage that guides a portion of the supply air in the cold aisle of the IT compartment into the OT compartment to moderate or cool a temperature of OT component(s) that may be installed within the OT compartment and/or (ii) a return air passage that guides air from the OT compartment(s) to the hot aisle of the IT compartment.

20 Claims, 7 Drawing Sheets

(56) References Cited

U.S. PATENT DOCUMENTS

| | | | |
|---|---|---|---|
| 10,704,258 B2 * | 7/2020 | Gardner | E04B 2/7407 |
| 10,736,231 B2 * | 8/2020 | Bailey | H05K 7/1498 |
| 2006/0082263 A1 * | 4/2006 | Rimler | B60P 3/14 |
| | | | 312/201 |
| 2014/0273792 A1 * | 9/2014 | Kondo | H05K 7/20836 |
| | | | 454/184 |
| 2016/0198593 A1 | 7/2016 | Schmitt et al. | |
| 2017/0359922 A1 * | 12/2017 | Bailey | H05K 7/1498 |
| 2020/0015389 A1 * | 1/2020 | Gao | F24F 11/64 |

* cited by examiner

DATA CENTER THAT REGULATES SUPPLY AIR TO MULTIPLE COMPARTMENTS

BACKGROUND

1. Technical Field

The present disclosure generally relates to a data center with a management system, and in particular to a management system that regulates temperature within multiple compartments of a modular data center (MDC).

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Large-scale information handling systems are organized in data centers. Information technology (IT) components within the data center can store sensitive data and execute critical compute workloads. IT components consume the majority of the electrical power for the data center and thus have the majority of the cooling requirement. An efficient method of cooling is positioning the IT components between a cold aisle and a hot aisle. A positive pressure differential between the cold and the hot aisle results in cooling airflow through the IT components.

IT components are supported by operation technology (OT) components for infrastructure subsystems such as security, network communications, fire suppression, power distribution, data center management, etc. These infrastructures subsystems can be supported by vendors who have no need or authority to access the IT components. Consequently, the OT components are separated from the IT components in other compartments such as utility rooms and meet me rooms. The separation deprives the OT components of the cooling provided to the IT components. Although the OT components generate less heat, the OT components can require a lesser degree of cooling and can require being maintained within a specified range of environmental conditions for reliable operation. Adding dedicated cooling equipment for the OT components increases the costs for the data center.

BRIEF SUMMARY

Disclosed are a data center, an environmental subsystem and method for regulating supply air provided to multiple compartments without dedicated air handling systems for each compartment.

According to one embodiment, a data center regulates supply air provided to multiple compartments including an operation technology (OT) compartment and an information technology (IT) compartment, which has a cold aisle and a hot aisle. An environmental subsystem of the data center includes an air handling system that provides supply air to the cold aisle and that draws return air from the hot aisle. The supply air moderates or cools a temperature of IT component(s) that may be installed within the IT compartment, positioned between the cold aisle and the hot aisle. The environmental subsystem includes a supply air passage that guides a portion of the supply air in the cold aisle of the IT compartment to the OT compartment to moderate or cool a temperature of OT component(s) that may be installed within the OT compartment. A return air passage guides air from the OT compartment to the hot aisle of the IT compartment. Airflow regulation device(s) are positioned in at least one of the supply air passage and the return air passage.

According to a next embodiment, an environmental subsystem regulates supply air provided to multiple compartments of a data center. In one or more embodiments, the environmental subsystem includes an air handling system that provides supply air to a cold aisle and draws return air from a hot aisle of an IT compartment of the data center. The supply air moderates or cools a temperature of IT component(s) that may be installed within the IT compartment, positioned between the cold aisle and the hot aisle. A supply air passage guides a portion of the supply air in the cold aisle of the IT compartment to an OT compartment of the data center to moderate or cool a temperature of OT component(s) that may be installed within the OT compartment. A return air passage guides air from the OT compartment to the hot aisle of the IT compartment. Airflow regulation device(s) are positioned in the supply air passage and/or the return air passage.

According to another embodiment, a method is provided for regulating supply air provided to multiple compartments of a data center. In one or more embodiments, the method includes controlling an air handling system of an environmental subsystem to moderate or cool a temperature of IT component(s) positioned between a cold aisle and a hot aisle within an IT compartment. The air handling system provides supply air to the cold aisle and draws return air from the hot aisle of an IT compartment of the data center. The method includes actuating airflow regulation device(s) positioned in at least one of: (i) a supply air passage that guides supply air from the cold aisle of the IT compartment; and (ii) a return air passage that guides air from the OT compartment to the hot aisle of the IT compartment to adjust an amount of the supply air directed to an operation technology (OT) compartment of the data center.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

The illustrative embodiments provide a data center, an environmental subsystem, and a method for regulating supply air provided to multiple compartments, including an operation technology (OT) compartment and an information technology (IT) compartment, which has a cold aisle and a hot aisle. An environmental subsystem of the data center includes an air handling system that provides supply air to the cold aisle and that draws return air from the hot aisle to moderate or cool a temperature of IT component(s) that may be installed within the IT compartment. Airflow regulation device(s) are positioned in at least one of (i) a supply air passage; and (ii) a return air passage. The supply air passage guides a portion of the supply air in the cold aisle of the IT compartment to the OT compartment to moderate or cool a temperature of OT component(s) that may be installed within the OT compartment. The return air passage guides air from the OT compartment(s) to the hot aisle of the IT compartment.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized, and that logical, architectural, programmatic, mechanical, electrical and other changes may be made without departing from the general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

Figure 1:
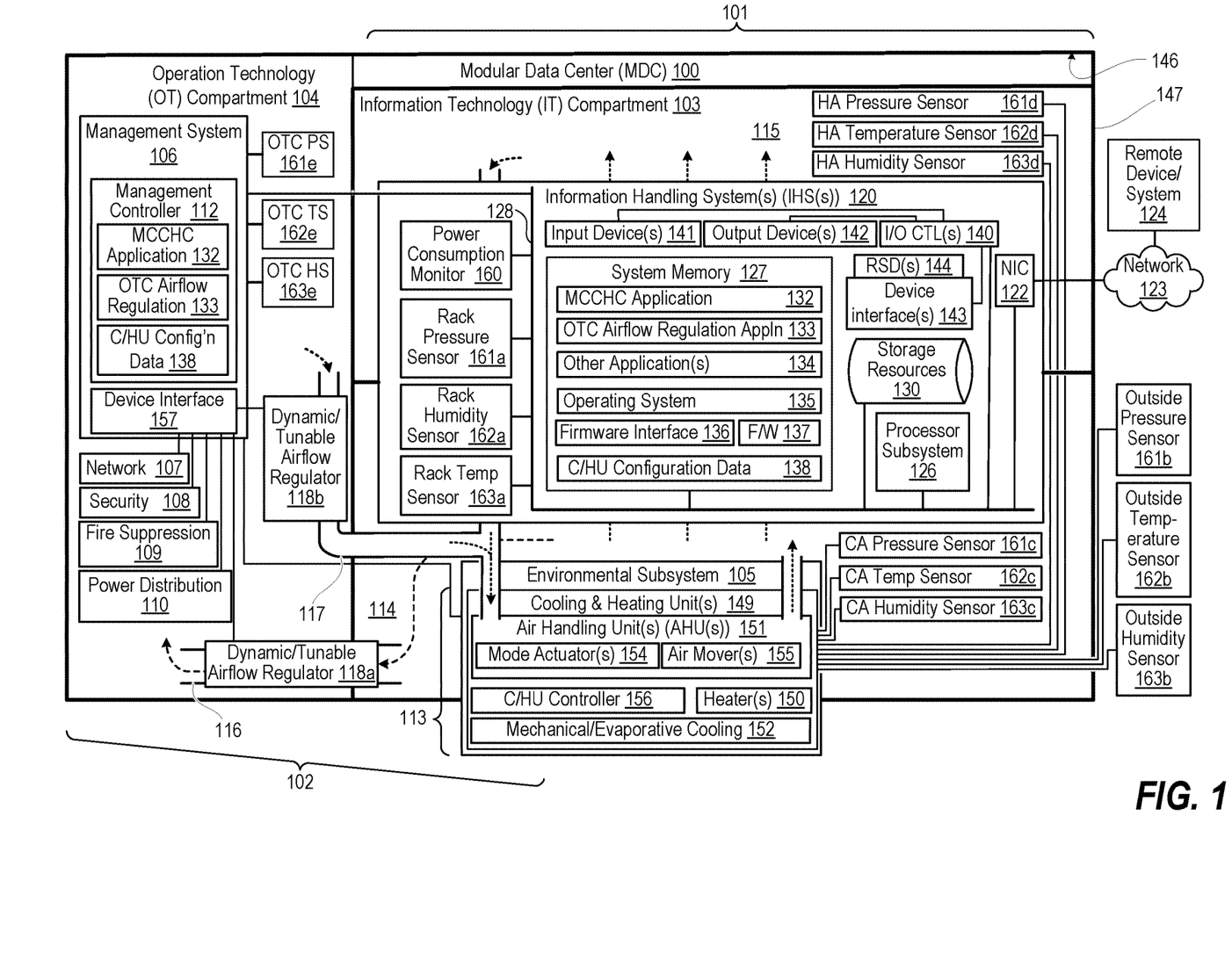
FIG. 1 depicts a simplified functional block diagram of a modular data center (MDC) having regulated airflow to multiple compartments, according to one or more embodiments.

FIG. 1 depicts a simplified functional block diagram of a data center, and in particular a modular data center (MDC) 100 having an information technology (IT) compartment 103 that includes IT components 101. MDC 100 has operation technology (OT) compartment 104 that includes OT components 102. In one or more embodiments, IT components 101 and OT components 102 are segregated from each other by being placed in different compartments, such as IT compartment 103 and OT compartment 104, to provide different degrees of authorized personnel access. OT compartment 104 is physically located and extends between the cold aisle and hot aisle provided for IT compartment 103. OT compartment 104 can be provisioned as such as a utility room and/or a meet me room (MMR). Environmental subsystem 105 is primarily dedicated to efficiently maintaining IT components 101 within specified environmental operating conditions. MDC 100 can enable authorized access to OT components 102 that is different from authorized access provided to IT components 101. Certain OT components 102 can be installed within separate OT compartments 104. OT compartment 104 can provide access to infrastructure support functions, such as management system 106, network subsystem 107, security subsystem 108, fire suppression subsystem 109, and power distribution subsystem 110. Management controller 112 of management system 106 regulates supply airflow between IT compartment 103 and OT compartment 104 to moderate or cool a temperature of OT components 102.

Air handling system 113 of environmental subsystem 105 is primarily dedicated to IT compartment 103, providing supply air to cold aisle 114 and drawing return air from hot aisle 115. Supply air passage 116 guides a portion of the supply air in cold aisle 114 of IT compartment 103 to OT compartment 104 to moderate or cool a temperature of OT components 102 within OT compartment 104. Return air passage 117 guides air from OT compartment 104 to hot aisle 115 of IT compartment 103. Management controller 112 regulates airflow between IT compartment 103 and OT compartment 104 by adjusting dynamic/tunable airflow regulation device(s) 118a-118b. Dynamic/tunable airflow regulation device(s) 118a is positioned in supply air passage 116. Dynamic/tunable airflow regulation device(s) 118b is positioned in return air passage 117. With this configuration, the need for separate air handling systems dedicated to OT compartment 103 is eliminated.

OT components 102 support IT components 101, which include information handling systems (IHSs) 120. Within the general context of IHSs, IHS 120 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, IHS 120 may be a server, blade server, rack-mounted server, rack-mounted data storage, or other rack-mounted IT equipment. IHS 120 may include random access memory (RAM), one or more processing resources such as a central processing unit (CPU) or hardware or software control logic, read only memory (ROM), and/or other types of nonvolatile memory. Additional components of the IHS 120 may include one or more disk drives, one or more network ports for communicating with external devices as well as various input and output (I/O) devices, such as a keyboard, a mouse, and a video display. The IHS 120 may also include one or more buses operable to transmit communications between the various hardware components. In one or more embodiments, IHS 120 is rack-mounted to provide computing, communication and storage functionality in mobile MDC 100. One of IHS 120 may be programmed to perform the role of management controller 112.

IHS 120 includes a network interface, depicted as network interface controller (NIC) 122. NIC 122 is communicatively connected to network 123. Remote device systems 124 are also communicatively connected to network 123. NIC 122 enables IHS 120 and/or components within IHS 120 to communicate and/or interface with other devices, services, and components that are located external to IHS 120. IHS 120 receives IHS updates and work requests from remote device systems 124 via network 123. These devices, services, and components can interface with IHS 120 via an external network, such as network 123, using one or more communication protocols that include transport control protocol (TCP/IP) and network block device (NBD) protocol. Network 123 can be a local area network, wide area network, personal area network, and the like, and the connection to and/or between network 123 and IHS 120 can be wired, wireless, or a combination thereof. For purposes of discussion, network 123 is indicated as a single collective component for simplicity. However, it should be appreciated that network 123 can comprise one or more direct connections to other devices as well as a more complex set of interconnections as can exist within a local area network or a wide area network, such as the Internet.

A processor subsystem 126 is coupled to system memory 127 via system interconnect 128. System interconnect 128 can be interchangeably referred to as a system bus, in one or more embodiments. System interconnect 128 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus. For the purpose of this disclosure, system interconnect 128 can also be a Double Data Rate (DDR) memory interface. The system memory 127 can either be contained on separate, removable dual inline memory module (RDIMM) devices or system memory 127 can be contained within persistent memory devices (NVDIMMs). For example, the NVDIMM-N variety of NVDIMMs contain both random access memory, which can serve as system memory 127, and non-volatile memory. It should be noted that other channels of communication can be contained within system interconnect 128, including but not limited to inter-integrated circuit (i2c) or system management bus (SMBus). System interconnect 128 communicatively couples various system components. Examples of system components include replaceable local storage resources 130 (illustrated as "Storage Resources") such as solid state drives (SDDs) and hard disk drives (HDDs). Software and/or firmware modules and one or more sets of data that can be stored on local storage resources 130 and be utilized during operations of IHS 120. Specifically, in one embodiment, system memory 127 can include therein a plurality of such modules, including multiple compartment cooling/heating control (MCCHC) application 132, operation technology compartment (OTC) airflow regulation application 133, other application(s) 134, operating system (OS) 135, a firmware (F/W) interface 136 such as basic input/output system (BIOS) or Uniform Extensible Firmware Interface (UEFI), and platform firmware 137. These software and/or firmware modules have varying functionality when their corresponding program code is executed by processor subsystem 126 or secondary processing devices within IHS 120. For example, other application(s) 134 may include a word processing application and a presentation application, among other applications. System memory 127 can include computer data structures and data values, such as cooling/heating configuration data 138 that specifies environmental ranges and limits for IT components 101 and OT components 102. These data structures and values can be used by applications (132, 133).

IHS 120 further includes one or more input/output (I/O) controllers 140 that support connection by and processing of signals from one or more connected input device/s 141, such as a keyboard, mouse, touch screen, or microphone. I/O controllers 140 also support connection to and forwarding of output signals to one or more connected output devices 142, such as a monitor or display device or audio speaker(s). Additionally, in one or more embodiments, one or more device interfaces 143, such as an optical reader, a universal serial bus (USB), a card reader, Personal Computer Memory Card International Association (PCMCIA) slot, and/or a high-definition multimedia interface (HDMI), can be associated with IHS 120. Device interface(s) 143 can be utilized to enable data to be read from or stored to corresponding removable storage device/s 144, such as a compact disk (CD), digital video disk (DVD), flash drive, or flash memory card. In one or more embodiments, device interface(s) 143 can further include general purpose I/O interfaces such as inter-integrated circuit (I²C), system management bus (SMB), and peripheral component interconnect (PCI) buses.

Enclosure structure 146 refers to a barrier that encompasses an IT space for internally directing supply air. In one or more embodiments, volumetric container 147 provides enclosure structure 146. In one or more alternate embodiments, enclosure structure 146 is a building that houses a data center. Environmental subsystem 105, managed by management controller 112 of management system 106, provides cooling air to meet the cooling requirements of IHSs 120. IHSs 120 can be positioned in one or more spaces defined within enclosure structure 146 of MDC 100 for which sensing and cooling is specifically handled by management controller 112. In one or more embodiments, IHSs 120 are positioned in racks installed in the one or more spaces defined in the enclosure structure 146 of MDC 100. In some instances, environmental subsystem 105 warms the supply air to a specified level required for operation by one or more of the IT components 101 at one or more associated operating states. The cooling/heating requirements can include specified temperature and humidity ranges for startup, standby, and operation of IHSs 120. Operating outside of these ranges can degrade the service life or prevent effective operation of IHSs 120. Environmental subsystem 105 can include air handling system(s) 113, such as stand-alone cooling and heating unit(s) 149, which include heater(s) 150, air handling unit(s) (AHU(s)) 151, and evaporative/mechanical cooling subsystems 152. AHU(s) 151 have mode actuators 154 that configure airflow for one of closed loop recirculation, open loop venting with cooling by outside air, or a mixed mode with a partial recirculation of air. The air is moved by air mover(s) 155 of AHU(s) 151. Management controller 112 can include some or all of the components and functionality described above for IHSs 120. In one or more embodiments, management controller 112 acts as supervisory controller to respective control cooling/heating unit (C/HU) controllers 156 that control corresponding cooling and heating unit(s) 149 of environmental subsystem 105. In one or more embodiments, management controller 112 executes MCCHC application 132 and air pressure limiting application 134 to enable MDC 100 to provide the functionality described herein.

In one or more embodiments, IHSs 120 can communicate cooling requirements to management controller 112, via device interface 157. In one or more embodiments, management controller 112 can determine cooling requirements based in part on the received cooling requirements of IHSs 120 based on values provided by power consumption monitor 160, rack pressure sensor 161*a*, rack humidity sensor 162*a*, and rack temperature sensor 163*a*. For example, the cooling requirement can indicate a temperature set point and a current temperature of the supply air and a current temperature of the return air. As another example, the cooling requirement can indicate a current heat load being produced by IHSs 120. In one or more embodiments, management controller 112 can determine cooling requirements based in part on outside environmental sensors, depicted as outside pressure sensor 161*b*, outside temperature sensor 162*b*, and outside humidity sensor 163*b*. In one or more embodiments, management controller 112 can determine respective cooling requirements for each of separate zones defined within IT compartment 103 based in part on cold aisle (CA) environmental sensors depicted as CA pressure sensor 161*c*, CA temperature sensor 162*c*, and CA humidity sensor 163*c* based in part on hot aisle (HA) environmental sensors depicted as HA pressure sensor 161*d*, HA temperature sensor 162*d*, and HA humidity sensor 163*d*. In one or more embodiments, management controller 112 can determine cooling requirements and differential air pressure limiting for OT compartment 104 based in part on operation technology compartment (OTC) environmental sensors depicted as OTC pressure sensor 161*e*, OTC temperature sensor 162*e*, and OTC humidity sensor 163*e*.

In one or more embodiments, management system 106 controls infrastructure support to IHSs 120 in MDC 100, including control of environmental subsystem 105, network subsystem 107, security subsystem 108, fire suppression subsystem 109, and power distribution subsystem 110. Management system 106 can be assigned to control these functions within a particular volumetric container 147. In one or more embodiments, management system 106 is part of IHS 120. In one or more embodiments, management system 106 is part of environmental subsystem 105. In one or more embodiments, management system 106 is at least partially remotely located, such as management functions being performed by remote device system 124. In one or more embodiments, management controller 112 is a programmable logic controller (PLC) that is connected to the other subsystems via one or more interconnects and communication protocols. Management controller 112 interfaces with IHSs 120, and the infrastructure subsystems (105, 107, 108, 109, and 110) and communicates to a network operations center or building management system.

In one or more embodiments, environmental subsystem 105 detects, via input from air sensors, an outside ambient condition as being in one of multiple environmental condition ranges. In one or more embodiments, the environmental condition ranges are defined on a psychrometric chart that is tailored for a location of the data center. In an illustrative embodiment, environmental subsystem 105 is equipped to operate in one of four cooling modes defined by environmental condition ranges that are mutually exclusive and which cover the full range of environmental conditions that MDC 100 should encounter at the operational location. First, a "normal mode" provides open loop cooling using outside air. Second, a "mixed mode" provides mixing outside air with recirculated return air that is warmed by the data center. Third, a "mechanical trim mode" includes mixing of outside air with recirculated return air. Fourth, a "closed mode" recirculates all return air with cooling provided by the mechanical cooling subsystem. In one or more embodiments, fewer modes may be required for a particular location. Other environmental considerations such as the amount of contaminants in the outside air can affect mode selection, including reverting to closed loop cooling. The ranges of environmental conditions are based at least on outside air temperature and outside air humidity.

Figure 2:
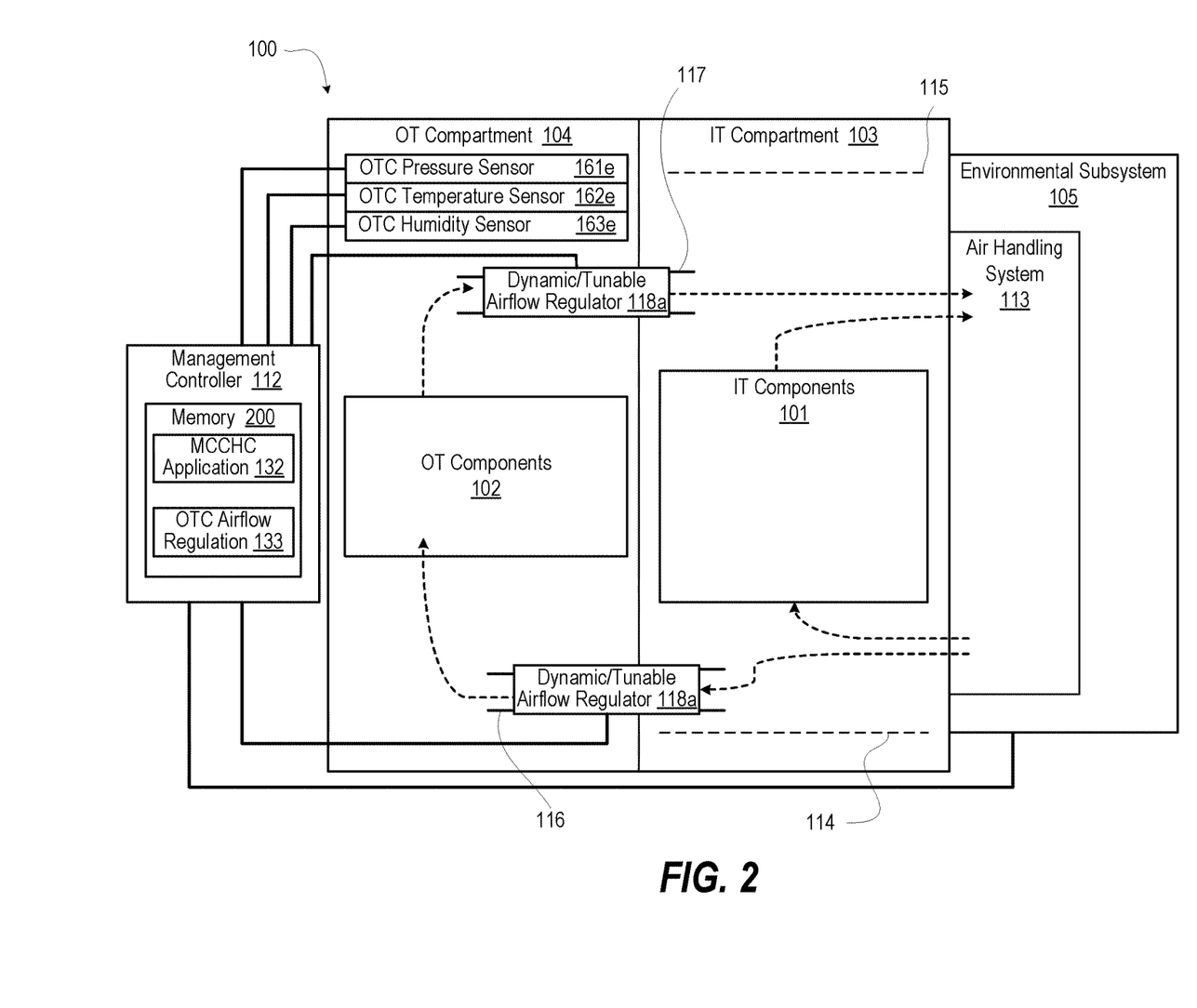
FIG. 2 is a simplified functional block diagram of the MDC of FIG. 1 illustrating components of a control loop that regulates supply air provided to an information technology (IT) compartment and an operation technology (OT) compartment, according to one or more embodiments.

FIG. 2 is a simplified functional block diagram of MDC 100 illustrating components in a control loop that regulates supply air provided to multiple compartments within volumetric container 146 including IT compartment 103 and OT compartment 104. IT component(s) 101 are installed within IT compartment 103 between cold aisle 114 and hot aisle 115. Air handling system 113 provides supply air to cold aisle 114 and that draws return air from hot aisle 115 to moderate or cool a temperature of IT component(s) 101. Supply air passage 116 guides a portion of supply air 200 in cold aisle 114 of IT compartment 103 to OT compartment 104 to moderate or cool a temperature of OT component(s) 102. Return air passage 117 guides return air 202 exiting from OT compartment 104 to hot aisle 115 of IT compartment 103. Airflow regulation devices 118a-118b are positioned in supply air passage 116 and return air passage 117. In one or more embodiments, airflow regulation devices 118a-118b are electrically-actuated louvers that are communicatively coupled to and controlled by management controller 112. Environmental subsystem 105 includes environmental sensors in OT compartment 104: OTC pressure sensor 161e, OTC temperature sensor 162e, and OTC humidity sensor 163e.

Management controller 112 includes or is communicatively coupled to memory 200, which stores MCCHC application 132 and OTC airflow regulation application 133. Management controller 112 is communicatively coupled to OTC environmental sensors (161e, 162e, and 163e) and airflow regulation device 118a-118b. Management controller 112 executes MCCHC application 132 and OTC airflow regulation application 133 to enable environmental subsystem 105 to perform aspects of the present disclosure. In at least one embodiment, management controller: (a) receives at least one environmental value from OTC environmental sensors (161e, 162e, and 163e); (b) determines, based on the at least one environmental value, a cooling requirement of OT component(s) 101 located within OT compartment 103; (c) determines a change in an amount of the supply air guided to OT compartment 104 that corresponds to the cooling requirement; and (d) actuates airflow regulation device(s) 118a-118b to adjust the amount of the supply air guided to OT compartment 104 according to the change required in the amount of the supply air.

Figure 3:
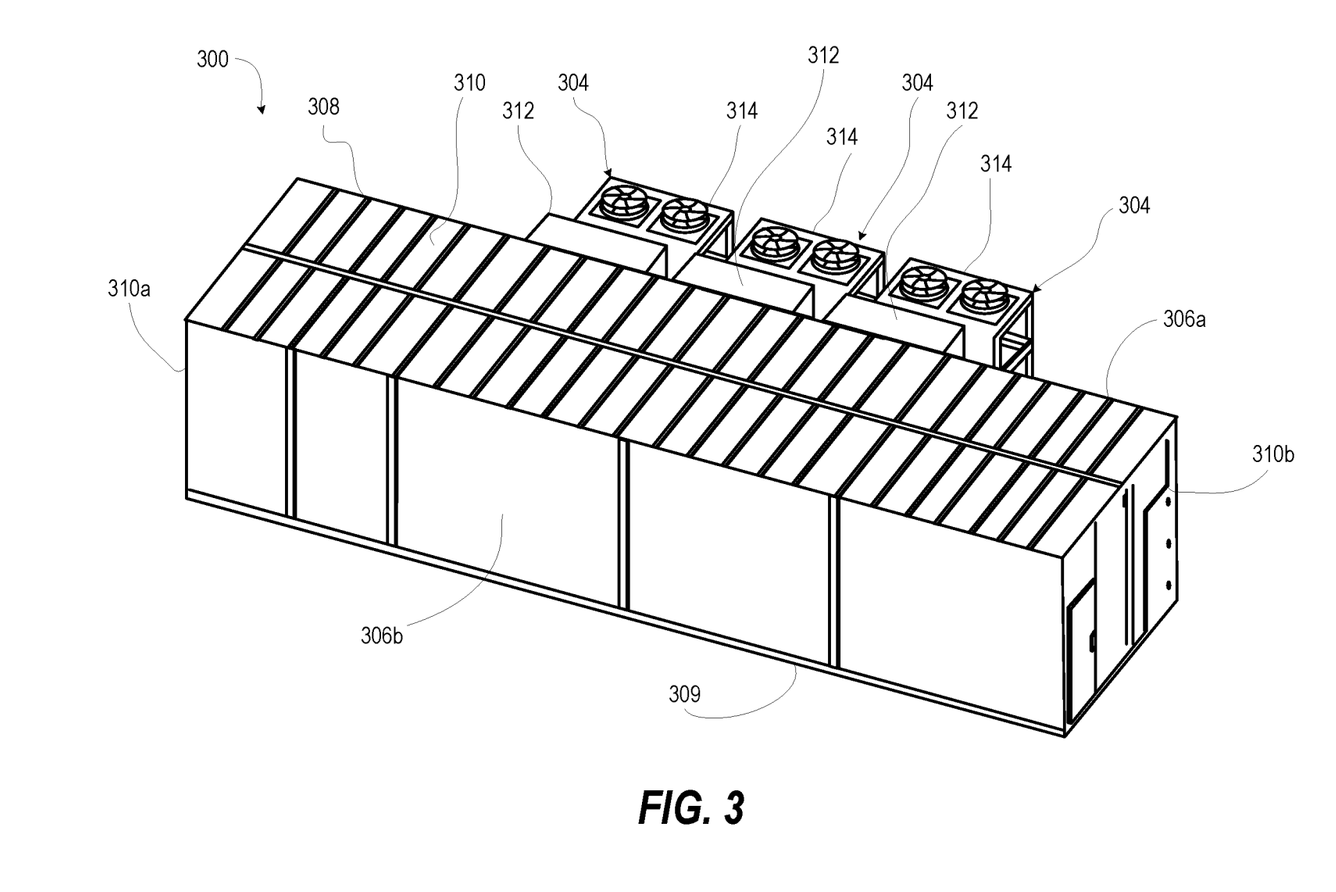
FIG. 3 depicts a three-dimensional view of an example MDC having three air handling systems side mounted to a volumetric container, according to one or more embodiments.

FIG. 3 depicts a three-dimensional view of example MDC 300 having environmental subsystem 302 with three air handling systems 304 side-mounted to a central portion of first longitudinal side 306a of volumetric container 307. MDC 300 is an example implementation of MDC 100 (FIG. 1) containing similar or identical components in a particular arrangement. Volumetric container 307 includes second longitudinal side 306b, first and second lateral sides 308a-308b, floor 309, and roof 310. Each air handling system 304 includes AHU 312 and cooling/heating unit 314. Multiple air handling systems 304 are closely positioned to each other for providing backup capabilities in the event of failure of one of air handling systems 304. Multiple air handling systems 304 are also closely positioned to each other for providing scalable cooling capabilities to the central portion of volumetric container 307. Selected combinations of one, two, or three air handling systems 304 can be activated to meet a particular cooling requirement.

Figure 4:
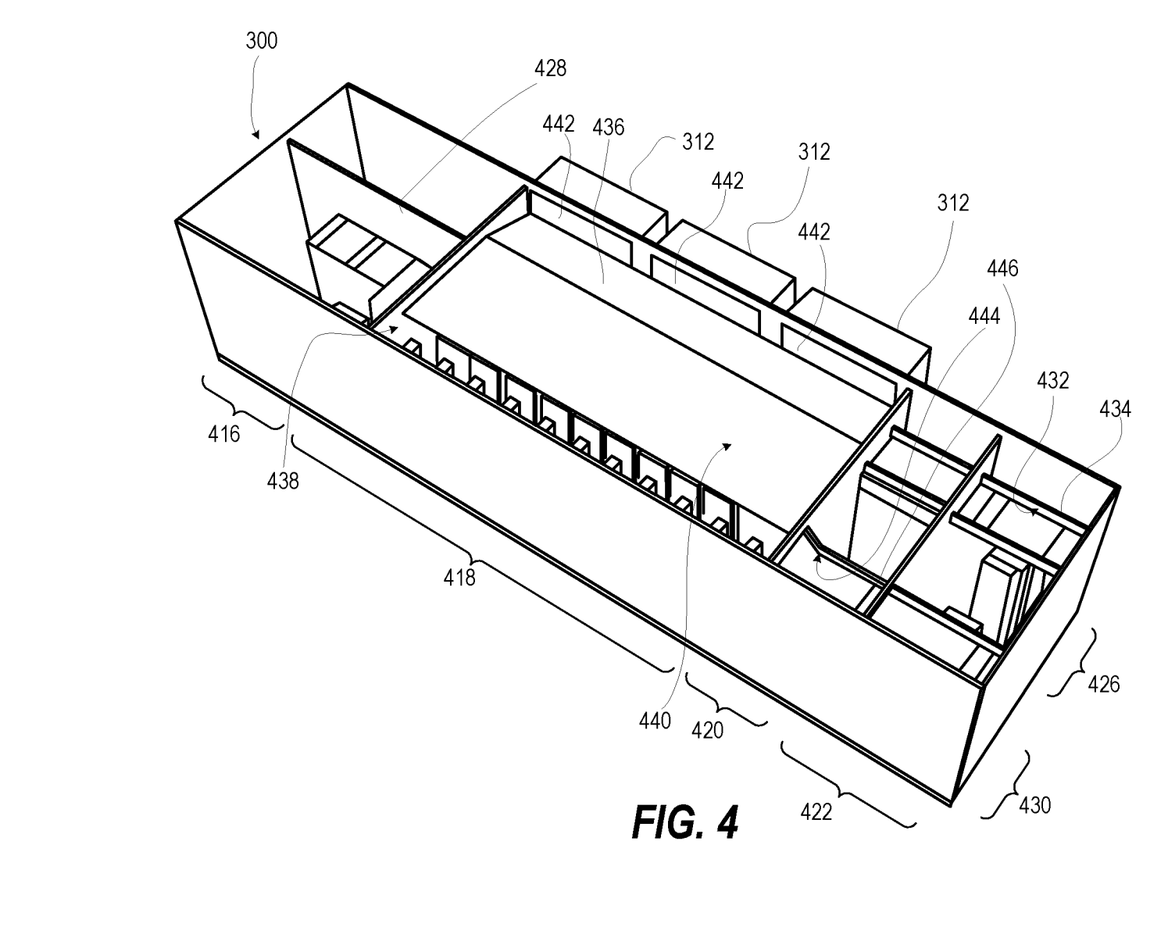
FIG. 4 depicts a three-dimensional cutaway view of the example MDC of FIG. 3 having airflow regulated to multiple compartments, according to one or more embodiments.

FIG. 4 depicts a three-dimensional cutaway view of example MDC 300 having four (4) internal compartments: (i) power room 416; (ii) IT compartment 418; (iii) entry access room 420; and (iv) meet me room 422. Airflow containment wall 428 extends longitudinally, dividing IT compartment 418 into cold aisle 426 and hot aisle 430. Supply air passage 432 is provided by supply air plenum/duct 434 extending from cold aisle 426 across a top of entry access room 420 and meet me room 422. Baffle 436 extends over most of IT compartment 418 with an opening 438 over hot aisle 430. Baffle 436 forms main return air plenum 440 with roof 310 (FIG. 3). Main return air plenum 440 guides return air from hot aisle 430 to return intakes 442 of AHUs 312. Return air passage 444 is located in return air plenum/duct 446. Return air passage 444 directs return air from meet me room 422 to main return air plenum 440.

Figure 5:
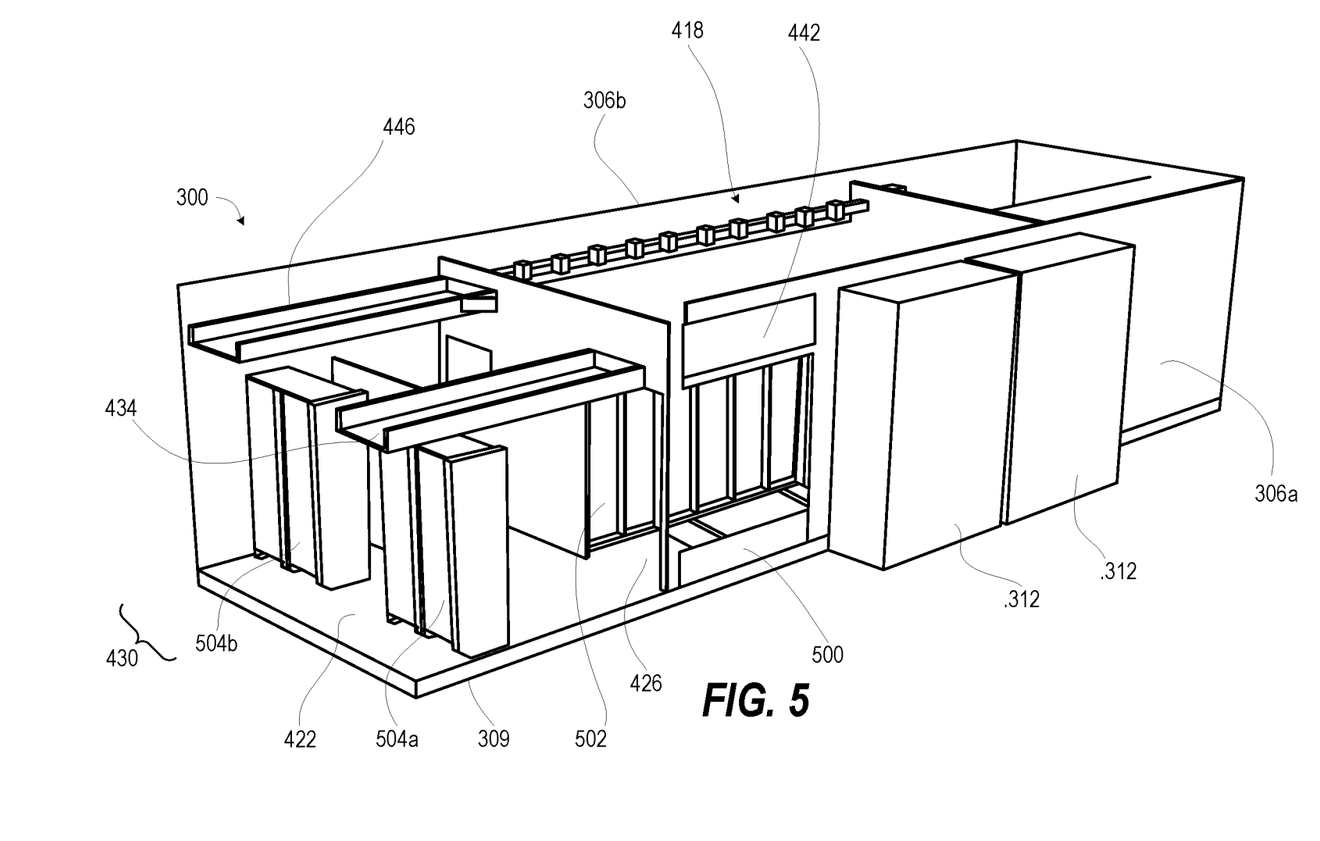
FIG. 5 depicts a three-dimensional cutaway view of the example MDC of FIG. 3 having supply and return air ducts from one compartment to another, according to one or more embodiments.

FIG. 5 depicts a three-dimensional cutaway view of example MDC 300 with two of three AHUs 312 depicted and a third AHU 312 being hidden to depict other components. Return intake 442 above supply outlet 500 is depicted where one AHU 312 is removed. Supply outlet 500 is proximate to cold aisle 426 on one side of a longitudinal array of IT components 101, depicted as rack information handling systems (RIHSs) 502. Supply air plenum/duct 434 is aligned longitudinally with an upper portion of cold aisle 426 and is directed over OT components 102, depicted as OT racks 504a-504b, in meet me room 422. The supply air plenum/duct 434 is elevated to provide walking space for personnel to access cold aisle 426 and to enable placement of OT rack 504a beneath supply air plenum/duct 434, such that supply air plenum/duct 434 does not occupy the same space as OT rack 504a. Return air plenum/duct 446 is aligned longitudinally with an upper portion of hot aisle 430 and is elevated above OT rack 504b in meet me room 422. Return air plenum/duct 446 is elevated to provide walking space for personnel to access hot aisle 430 and to enable placement of OT rack 504b beneath return air plenum/duct 446, such that supply air plenum/duct 434 by not occupy the same space as OT rack 504b.

Figure 6:
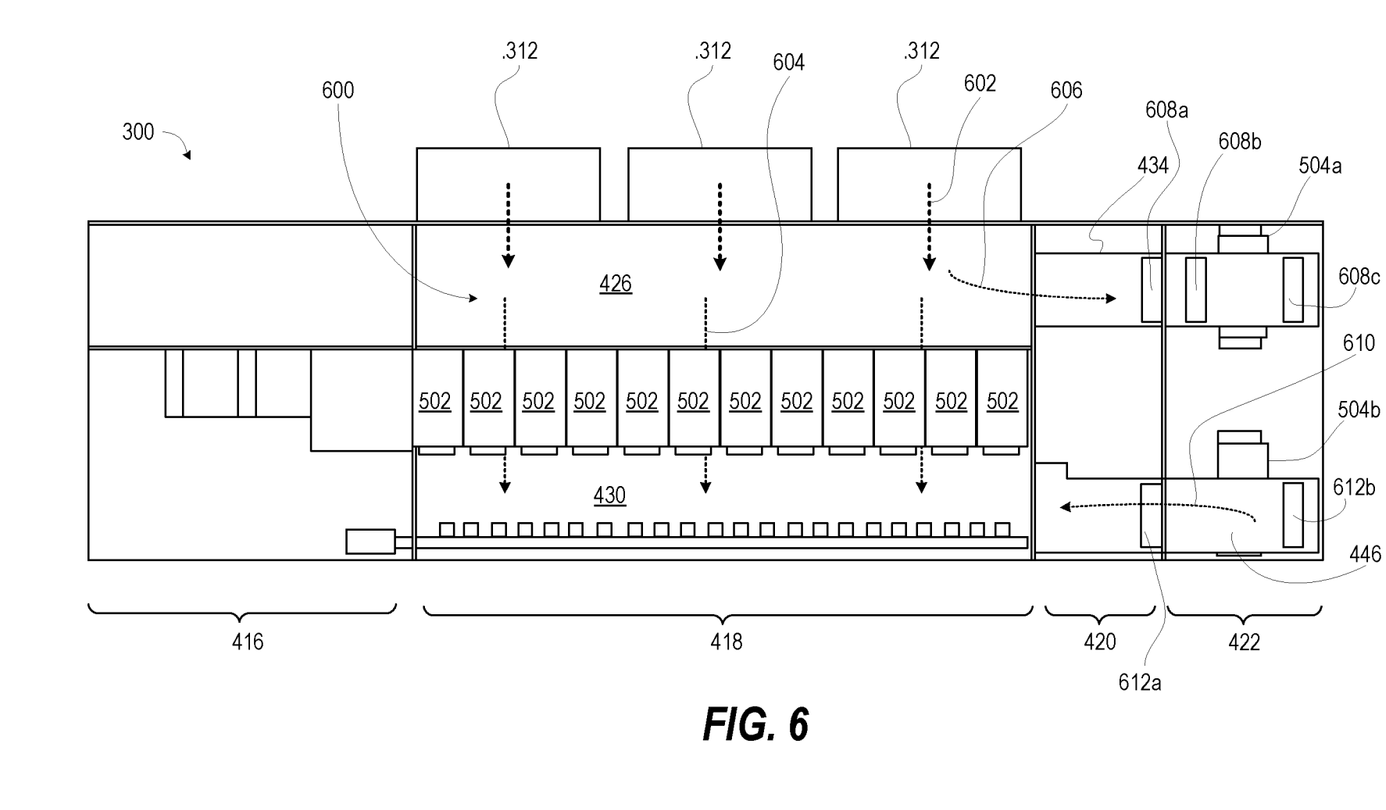
FIG. 6 depicts a top cutaway view of airflow circulation in the example MDC of FIG. 3, according to one or more embodiments.

FIG. 6 depicts a top cutaway view of airflow circulation 600 in example MDC 300. Supply airflow 602 passes from AHUs 312 into cold aisle 426. A larger portion of supply airflow 604 passes through RIHSs 502 into hot aisle 430. A smaller portion of supply airflow 606 is located in supply air plenum/duct 434 to meet me room 422. Supply airflow 606 is dynamically adjusted and tuned by airflow regulation devices to balance cooling needs of RIHSs 502 in IT compartment 418 and OT racks 504a-504b in meet me room 422. In one or more embodiments, MMR 422 is sufficiently passively cooled for any equipment installed in MMR 442. Dynamically adjusted and tuned airflow enables environmental settings to be established and/or modulated that benefits/accommodates use of MMR 422 by personnel. In one embodiment, airflow regulation devices include electrically-actuated louvers 608a-608c in supply air plenum/duct 434. Return airflow 610 is located in return air duct or plenum 446 and can also be dynamically adjusted and tuned by different set of airflow regulation devices, electrically-actuated louvers 612a-612b.

Figure 7:
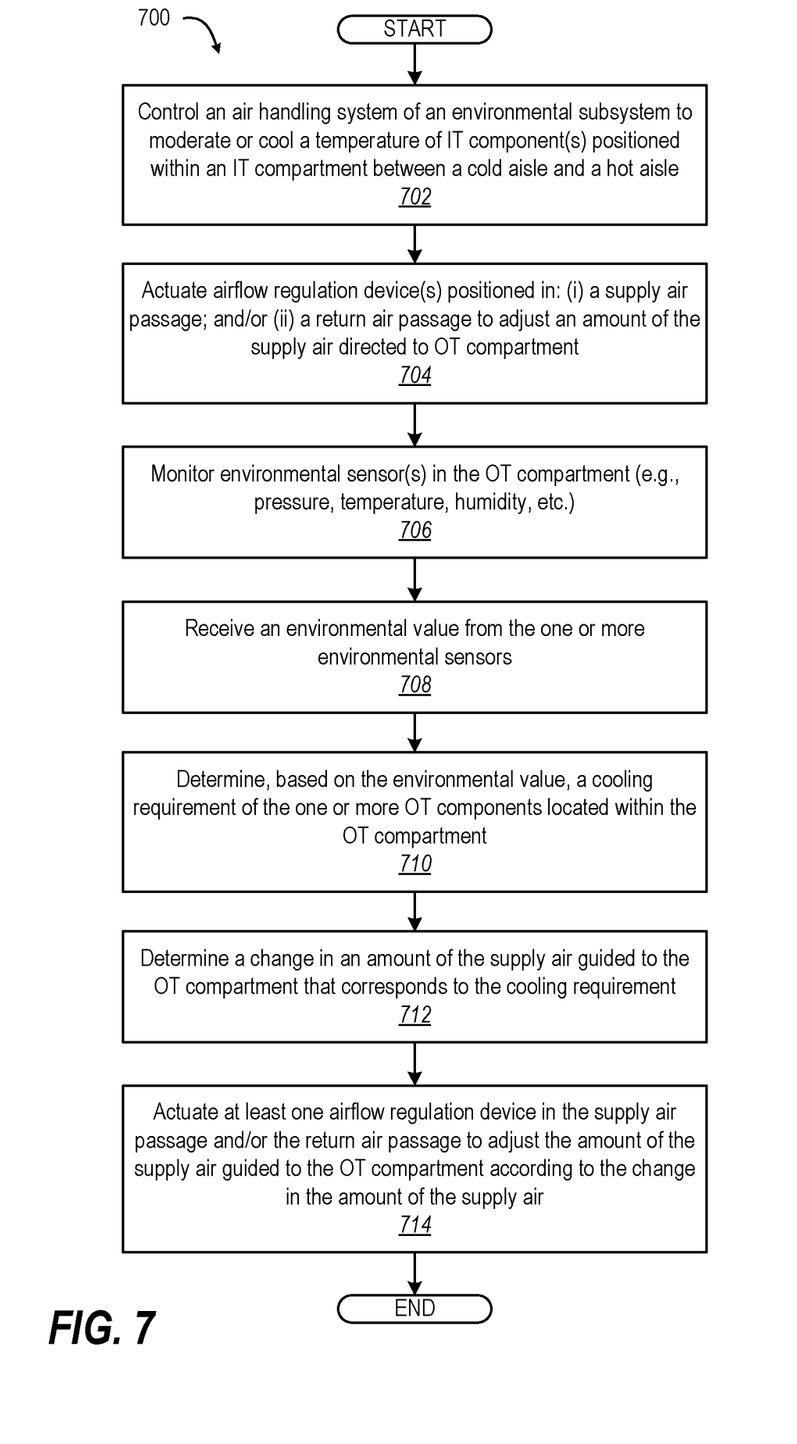
FIG. 7 presents a flow chart illustrating an example method for controlling airflow to multiple compartments in an MDC, according to one or more embodiments.

FIG. 7 presents a flow diagram of method 700 for regulating supply air provided to multiple compartments of a data center. The description of method 700 is provided with general reference to the specific components illustrated within the preceding FIGS. 1-6. In at least one embodiment, method 700 can be implemented using management controller 112 (FIGS. 1 and 2) that operates environmental subsystem 105 (FIG. 1). Method 700 includes controlling an air handling system of an environmental subsystem to moderate or cool a temperature of IT component(s) positioned within an IT compartment between a cold aisle and a hot aisle (block 702). The air handling system provides supply air to the cold aisle and draws return air from the hot aisle of an IT compartment of the data center. In one or more embodiments, the data center is an MDC that includes a volumetric container that encompasses the IT compartment, which houses/includes an OT compartment located between the cold aisle and the hot aisle. Method 700 includes actuating airflow regulation device(s) positioned in: (i) a supply air passage; and/or (ii) a return air passage to adjust an amount of the supply air directed to OT compartment (block 704). The supply air passage guides supply air from the cold aisle of the IT compartment into the OT compartment. The return air passage guides air from the OT compartment to the hot aisle of the IT compartment. OT compartment can be a utility room, a meet me room, or other separate, enclosed room. Method 700 includes monitoring environmental sensor(s) (e.g., pressure, temperature, humidity, etc.) in the OT compartment (block 706). Method 700 includes receiving an environmental value from the one or more environmental sensors (block 708). Method 700 includes determining, based on the environmental value, a cooling requirement of the one or more OT components located within the OT compartment (block 710). Method 700 includes determining a change in an amount of the supply air guided to the OT compartment that corresponds to the cooling requirement (block 712). Method 700 includes actuating at least one airflow regulation device in the supply air passage and/or the return air passage to adjust the amount of the supply air guided to the OT compartment according to the change required in the amount of the supply air (block 714). In one or more embodiments, the airflow regulation devices are electrically-actuated louvers. Then method ends.

In the above described flow charts, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A data center that regulates supply air provided to multiple compartments, the data center comprising:
   a volumetric container comprising a first longitudinal side, a second longitudinal side, first and second lateral sides, a floor and a roof, the volumetric container configured with:
      an information technology (IT) compartment, as one of the multiple compartments, and having a cold aisle and a hot aisle; and
      an operation technology (OT) compartment, as another one of the multiple compartments, and physically separated from the IT compartment by a physical barrier; and an environmental subsystem comprising:
      one or more air handling systems that is side-mounted to the first longitudinal side of the volumetric container and provides the supply air to the cold aisle and that draw return air from the hot aisle to moderate or cool a temperature of one or more IT components that are configured to be installed within the IT compartment, positioned between the cold aisle and the hot aisle;
      a supply air passage within the physical barrier that guides a portion of the supply air in the cold aisle of the IT compartment to the OT compartment to moderate or cool a temperature of one or more OT components that are configured to be installed within the OT compartment, the supply air passage comprising a supply air duct extending from the cold aisle though a first opening in the physical barrier and across a top of the one or more OT components when installed within the OT compartment;
      a return air passage that guides the return air from the OT compartment to the hot aisle of the IT compartment, the return air passage comprising a return air duct elevated over the top of the one or more OT components when installed within the OT compartment and extending from the OT compartment through a second opening in the physical barrier to the hot aisle; and
      at least one airflow regulation device positioned in a selected at least one of the supply air passage and the return air passage.

2. The data center of claim 1, further comprising:
   a memory containing a multiple compartment cooling application; and
   a controller that is communicatively coupled to the at least one airflow regulation device and the memory, the controller executing the multiple compartment cooling application to enable the environmental subsystem to actuate the at least one airflow regulation device to adjust an amount of the supply air guided to the OT compartment.

3. The data center of claim 2, wherein:
   the environmental subsystem comprises one or more environmental sensors in the OT compartment; and
   the controller is communicatively coupled to the one or more environmental sensors, the controller executing the multiple compartment cooling application to enable the environmental subsystem to:
      monitor the one or more environmental sensors;
      receive an environmental value from the one or more environmental sensors;
      determine, based on the environmental value, a cooling requirement of the one or more OT components located within the OT compartment;
      determine a change in an amount of the supply air guided to the OT compartment that corresponds to the cooling requirement; and
      actuate the at least one airflow regulation device to adjust the amount of the supply air guided to the OT compartment according to the determined change in the amount of the supply air.

4. The data center of claim 1, wherein the at least one airflow regulation device comprises at least one of:
   one or more electrically-actuated louvers positioned in the supply air passage; or
   one or more electrically-actuated louvers positioned in the return air passage.

5. The data center of claim 1, wherein the OT compartment comprises one or both of (i) a utility room and (ii) a meet me room.

6. The data center of claim 1, further comprising:
   the one or more IT components installed within the IT compartment between the cold aisle and the hot aisle; and
   the one or more OT components installed within the OT compartment.

7. The data center of claim 1, wherein the one or more air handling systems comprises multiple air handling systems closely positioned to each other to provide backup capabilities in event of a failure of any of the multiple air handling systems, and the multiple air handling systems provide scalable cooling capabilities to a central portion of the volumetric container, where selected combinations of one or more of the multiple air handling systems are activated to meet a particular cooling requirement.

8. An environmental subsystem of a data center, the environmental subsystem comprising:
   one or more air handling systems that provides supply air to a cold aisle and that draws return air from a hot aisle of an information technology (IT) compartment of the data center to moderate or cool a temperature of one or more IT components that are configured to be installed within the IT compartment, the one or more IT components positioned between the cold aisle and the hot aisle, the data center comprising a volumetric container that is configured to include the IT compartment and an operation technology (OT) compartment physically separated from the IT compartment by a physical barrier, the one or more air handling systems side-mounted to the volumetric container;
   a supply air passage that guides a portion of the supply air in the cold aisle of the IT compartment to the OT compartment of the data center to moderate or cool a temperature of one or more OT components that are configured to be installed within the OT compartment, the supply air passage comprising a supply air duct extending from the cold aisle though a first opening in the physical barrier and across a top of the one or more OT components when installed within the OT compartment;
   a return air passage that guides the return air from the OT compartment to the hot aisle of the IT compartment, the return air passage comprising a return air duct elevated over the top of the one or more OT components when installed within the OT compartment and extending from the OT compartment through a second opening in the physical barrier to the hot aisle; and at least one airflow regulation device positioned in a selected at least one of the supply air passage and the return air passage.

9. The environmental subsystem of claim 8, further comprising:

a memory containing a multiple compartment cooling application; and a controller that is communicatively coupled to the at least one airflow regulation device and the memory, the controller executing the multiple compartment cooling application to enable the environmental subsystem to actuate the at least one airflow regulation device to adjust an amount of the supply air guided to the OT compartment.

10. The environmental subsystem of claim 9, further comprising one or more environmental sensors in the OT compartment, wherein the controller is communicatively coupled to the one or more environmental sensors, the controller executing the multiple compartment cooling application to enable the environmental subsystem to:

monitor the one or more environmental sensors;

receive an environmental value from the one or more environmental sensors;

determine, based on the environmental value, a cooling requirement of the one or more OT components located within the OT compartment;

determine a change in an amount of the supply air guided to the OT compartment that corresponds to the cooling requirement; and actuate the at least one airflow regulation device to adjust the amount of the supply air guided to the OT compartment according to the determined change in the amount of the supply air.

11. The environmental subsystem of claim 8, wherein the at least one airflow regulation device comprises at least one of:

one or more electrically-actuated louvers positioned in the supply air passage; or one or more electrically-actuated louvers positioned in the return air passage.

12. The environmental subsystem of claim 8, wherein the supply air duct and the return air duct extend within the volumetric container.

13. The environmental subsystem of claim 12, wherein the supply air passage and the return air passage are in fluid communication with the OT compartment that comprises one or both of (i) a utility room and (ii) a meet me room.

14. The environmental subsystem of claim 8, wherein the one or more air handling systems comprises multiple air handling systems closely positioned to each other to provide backup capabilities in event of a failure of any of the multiple air handling systems, and the multiple air handling systems provide scalable cooling capabilities to a central portion of the volumetric container, where selected combinations of one or more of the multiple air handling systems are activated to meet a particular cooling requirement.

15. A method for regulating supply air provided to multiple compartments of a data center, the method comprising:

controlling one or more air handling systems of an environmental subsystem to moderate or cool a temperature of one or more information technology (IT) components positioned within an IT compartment of the multiple compartments between a cold aisle and a hot aisle, the air handling system providing the supply air to the cold aisle and drawing return air from the hot aisle of the IT compartment of the data center, the data center comprising a volumetric container that is configured to includes the IT compartment and an operation technology (OT) compartment of the multiple compartments that is physically separated from the IT compartment via a physical barrier, the one or more air handling systems side-mounted to the volumetric container; and actuating at least one airflow regulation device positioned in a selected one or both of: (i) a supply air passage that guides the supply air from the cold aisle of the IT compartment to the OT compartment, the supply air passage comprising a supply air duct extending from the cold aisle through a first opening in the physical barrier and across a top of the one or more OT components within the OT compartment; and (ii) a return air passage that guides the return air from the OT compartment to the hot aisle of the IT compartment to adjust an amount of the supply air directed to the OT compartment of the data center, the return air passage comprising a return air duct elevated over the top of the one or more OT components and extending from the OT compartment through a second opening in the physical barrier to the hot aisle.

16. The method of claim 15, further comprising:

monitoring one or more environmental sensors in the OT compartment;

receiving an environmental value from the one or more environmental sensors;

determining, based on the environmental value, a cooling requirement of the one or more OT components located within the OT compartment;

determining a change in an amount of the supply air guided to the OT compartment that corresponds to the cooling requirement; and actuating the at least one airflow regulation device to adjust the amount of the supply air guided to the OT compartment according to the determined change in the amount of the supply air.

17. The method of claim 15, wherein actuating the at least one airflow regulation device comprises at least one of:

actuating one or more electrically-actuated louvers positioned in the supply air passage; or actuating one or more electrically-actuated louvers positioned in the return air passage.

18. The method of claim 15, wherein the supply air duct and the return air duct extend within the volumetric container that encompasses the IT compartment and the OT compartment.

19. The method of claim 18, wherein the supply air passage and the return air passage are in fluid communication with the OT compartment, the OT compartment comprising one or both of (i) a utility room and (ii) a meet me room.

20. The method of claim 15, wherein the one or more air handling systems comprises multiple air handling systems closely positioned to each other to provide backup capabilities in event of a failure of any of the multiple air handling systems, and the multiple air handling systems provide scalable cooling capabilities to a central portion of the volumetric container, where selected combinations of one or more of the multiple air handling systems are activated to meet a particular cooling requirement.

* * * * *